US007616636B2

United States Patent
Ben Rached et al.

(10) Patent No.: US 7,616,636 B2
(45) Date of Patent: Nov. 10, 2009

(54) METHOD AND DEVICE FOR RECEIVING DATA BLOCKS

(75) Inventors: Nidham Ben Rached, Paris (FR); Stéphane Cayla, Viroflay (FR); Arnaud De Lannoy, Versailles (FR)

(73) Assignee: Nortel Networks Limited, St. Laurent, Quebec (CA)

( * ) Notice: Subject to any disclaimer, the term of this patent is extended or adjusted under 35 U.S.C. 154(b) by 931 days.

(21) Appl. No.: 10/830,336

(22) Filed: Apr. 22, 2004

(65) Prior Publication Data

US 2005/0002476 A1 Jan. 6, 2005

(30) Foreign Application Priority Data

Apr. 30, 2003 (FR) .................................. 03 05328

(51) Int. Cl.
- H04L 12/28 (2006.01)
- H04L 5/12 (2006.01)
- H04L 23/02 (2006.01)
- G06F 11/00 (2006.01)
- H03M 13/00 (2006.01)

(52) U.S. Cl. .......................... 370/392; 375/262; 714/48; 714/758

(58) Field of Classification Search ................. 370/252, 370/328, 389, 474; 375/262; 714/21, 25, 714/30, 49, 52, 53, 54, 699, 700, 701, 709, 714/746, 747, 748, 749, 750, 751, 752, 753, 714/758, 760, 761, 762, 764, 768, 774, 776, 714/778, 779, 786, 787, 788, 791, 792, 794, 714/795, 798, 799

See application file for complete search history.

(56) References Cited

U.S. PATENT DOCUMENTS 5,960,010 A * 9/1999 Liu et al. .................... 714/786
6,331,829 B2 * 12/2001 Kawai .......................... 341/94
2002/0015405 A1 * 2/2002 Sepponen et al. ........... 370/389
2002/0041570 A1 * 4/2002 Ptasinski et al. ............ 370/252
2002/0126664 A1 * 9/2002 Kiiski et al. ................. 370/389

FOREIGN PATENT DOCUMENTS

EP 0 897 228 2/1999

OTHER PUBLICATIONS

ETSI EN 300 909 European standard, Digital cellular telecommunications system (Phase 2+) ; Channel coding (GSM 05.03, version 8.5.1, Release 1999) published by the ETSI in Nov. 2000.
ETSI TS 101 350, "Digital cellular telecommunications system (Phase 2+); General Packet Radio Service (GPRS); Overall description of the GPRS radio interface; Stage 2" (GSM 03.64, version 8.5.0, Release 1999), published by ETSI (European Telecommunications Standards Institute) in Aug. 2000.

(Continued)

Primary Examiner—Chirag G Shah
Assistant Examiner—Ashley L Shivers
(74) Attorney, Agent, or Firm—Trop Pruner & Hu, P.C.

(57) ABSTRACT

Data blocks to be received each comprise a header and a data field including respectively first and second codes for error detection. The decoding of a signal segment received having first and second portions corresponding respectively to the header and to the data field of a block gave rise to a verification of the first code in the first portion. If the first code is correct, a check is made to verify whether the second portion of the decoded signal has a second correct code. A data block is considered to be detected either in the presence of first and second correct codes, or in the presence only of a first correct code when a data likelihood criterion, evaluated during the decoding of the second portion of the signal, is fulfilled.

23 Claims, 4 Drawing Sheets

OTHER PUBLICATIONS

ETSI EN 301 349, "Digital cellular telecommunications system (Phase 2+); General Packet Radio Service (GPRS); Mobile Station (MS)—Base Station System (BSS) interface; Radio Link Control/Medium Access Control (RLC/MAC) protocol" (GSM 04.60, version 8.3.1, Release 1999), published by ETSI in Oct. 2000.

TS 100 911, version 8.13.0, "Digital cellular telecommunications system (Phase 2+); Radio Subsystem Link Control" (3GPP TS 05.08 Release 1999), published in Feb. 2002 by the 3GPP.

G.D Forney, "the Viterbi Algorithm", Proc. IEEE, vol. 61,N°3, Mar. 1973, pp. 268-278).

* cited by examiner

METHOD AND DEVICE FOR RECEIVING DATA BLOCKS

BACKGROUND OF THE INVENTION

The present invention relates to digital communication techniques, and more particularly to the reception of data blocks into which are inserted error detection codes.

It is very usual to make provision for such codes in transmitted data block formats. They are generally codes appended to the data of the block by applying a systematic cyclic coding. One speaks of parity checking or CRC ("cyclic redundancy checksum") codes.

The invention is more particularly aimed at systems where provision is made for at least two codes of this kind within a data block, to check the integrity of distinct parts of the block: a header and one or more data fields.

Often, the information contained in the header of a block is more important than that contained in the data fields. The header may thus specify information useful for the reception of the remainder of the data of the block or for the proper operation of the receiver (identification of the recipient of the block, format of the data, modulation, error correcting coding applied, information useful for the link layer protocols, etc). To further protect this information, a coding scheme that is more robust to errors is applied to the header and the former is furnished with a CRC distinct from that used for the data field.

Such a distinction is for example envisaged for the transmission of data in the cellular radio communication system of EGPRS type ("Enhanced General Packet Radio Service") standardized by the ETSI ("European Telecommunications Standards Institute"). This system makes it possible to transmit, between a base station and a mobile station, modulated-signal blocks that may form the subject of several modulations and of several transmission error correcting codings. The modulation and the coding are selected block by block by choosing a Modulation and Coding Scheme MCS from among nine schemes MCS-1 to MCS-9 specified in the ETSI EN 300 909 European standard, Digital cellular telecommunications system (Phase 2+); Channel coding (GSM 05.03, version 8.5.1, Release 1999) published by the ETSI in November 2000. Each of these schemes offers a level of data protection that is more or less robust and correspondingly a bigger or smaller information bit rate.

The header of an EGPRS radio block comprises an 8-bit CRC, while its data field comprises a 12-bit CRC.

The choice of the modulation and coding scheme applied to a block results from a link adaptation algorithm whose input variables comprise, for each mobile station, parameters representing the quality of reception observed by the receiver (the mobile station in the downlink direction or the base station in the uplink direction). Mediocre quality (high bit error rate) attests to difficult propagating conditions, and requires an increase in the protection against errors for the mobile concerned and hence a reduction in the useful bit rate.

The presence of a block originating from a given mobile station or destined for the latter is decided by the receiver when the CRC of the header is correct and when the content of the header designates this mobile station. This decision makes it possible to update the relevant quality estimators.

The size of the CRC of the header (8 bits) gives rise to a false detection probability of $1/256$, i.e. around once every 5 seconds. When a false detection such as this occurs, the link adaptation relating to the mobile station designated in the header is disturbed. In particular, if no block were transmitted (noise alone), the quality indicator for the mobile station in question degrades, so that it undergoes a decrease in useful bit rate, although it perhaps benefits from excellent radio conditions.

The link adaptation techniques are not the only ones that may be disturbed through the false detection of data blocks. For example, such is the case also for automatic block repetition (ARQ) techniques with incremental redundancy (IR). In these techniques, the data of a block badly decoded by the receiver are preserved by the latter and a repeat thereof is requested. The data preserved then enrich those obtained following the repeat so as to increase the probability of detection. It is important to prevent a block from being detected in error in the presence of noise alone since this may introduce confusion into the controlling of the sending of blocks.

These drawbacks may be attenuated by increasing the size of the CRC of the header. However, this is to the detriment of the transmission bit rate, and is not possible in a system whose formats are already standardized.

An object of the present invention is to minimise the risks of false detection of such blocks having several codes for error detection.

SUMMARY OF THE INVENTION

The invention thus proposes a method for receiving data blocks each comprising a header and a data field including respectively first and second codes for error detection, comprising the steps of:

decoding a first portion of a signal received;

ignoring the signal received if the decoded signal of the first portion has a first incorrect code; and if the decoded signal of the first portion has a first correct code, determining a block header in accordance with the first portion and for at least one value of this block header:

decoding a second portion of the signal received;

if the decoded signal of the second portion has a second correct code, validating the block header and a corresponding data field determined in accordance with the second portion; and if the decoded signal of the second portion has a second incorrect code, validating the block header if a likelihood parameter evaluated during the decoding of the second portion fulfils a validation criterion and rejecting the block header if the likelihood parameter does not fulfill the validation criterion.

Fortuitous detection of a block header in the presence of noise only will generally be prevented by virtue of the likelihood criterion applied. This criterion will not be fulfilled in the presence of noise alone whereas the reception under poor conditions of a relevant block (first code correct but second code incorrect) will generally give rise to a greater likelihood than that observed in the presence of noise only. The criterion may thus consist in comparing the likelihood parameter with a suitably chosen, fixed or adaptive, threshold.

Another aspect of the invention concerns a device for receiving data blocks comprising processing means devised for implementing a method as defined hereinabove. The invention also proposes a cellular radio communication base station as well as a mobile station, including such a device for receiving data blocks.

DESCRIPTION OF PREFERRED EMBODIMENTS

The invention is described below in its non-limiting application to EGPRS type networks. These networks are developed for the transmission of data in packet mode in cellular networks of GSM ("Global System for Mobile communications") type.

Figure 1:
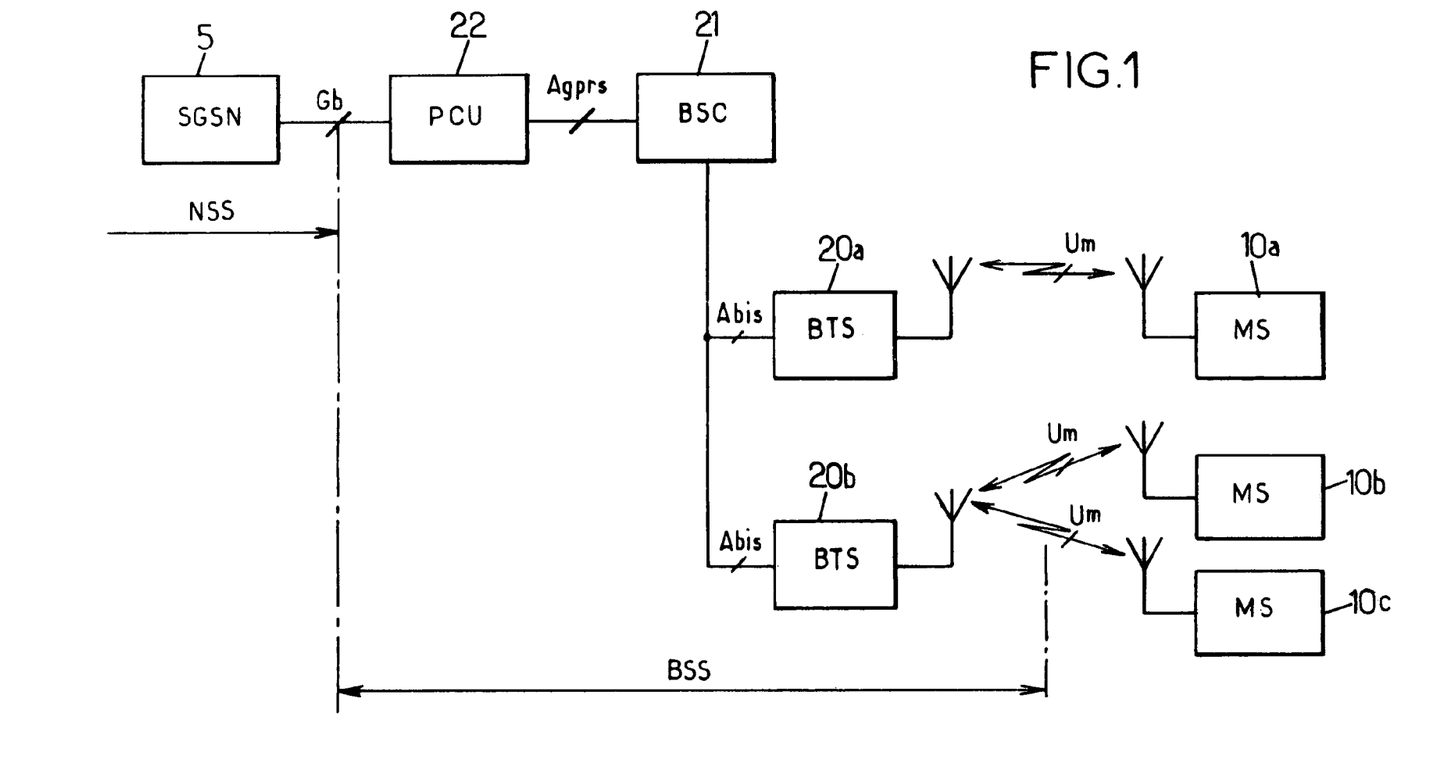
FIG. 1 is a diagram of a GPRS type network to which the invention may be applied.

The EGPRS network illustrated in FIG. 1 is built on a GSM infrastructure, and conventionally divided into a network core, also called Network and Switching Subsystem or NSS, and a radio-access network also called Base Station Subsystem or BSS.

For the packet service, the switches of the NSS are called GPRS Support Nodes or GSNs. A distinction is made between the SGSNs (Serving GSNs) 5 which are linked to the BSS through an interface called Gb, and the GGSNs (Gateway GSNs, not represented) which serve as a gateway with external packet transmission networks, such as the Internet, for example.

A general description of the radio interface, called Um, between the mobile stations (MS) 10a-10b-10c and the base stations (BTS) 20a-20b of the BSS is provided in the technical specification ETSI TS 101 350, "Digital cellular telecommunications system (Phase 2+); General Packet Radio Service (GPRS); Overall description of the GPRS radio interface; Stage 2" (GSM 03.64, version 8.5.0, Release 1999), published by ETSI (European Telecommunications Standards Institute) in August 2000.

Each base station 20a-20b is supervised by a base station controller or BSC 21 through an interface called Abis. In order to manage the transmission of GPRS packets, the BSS further comprises an entity 22 called packet control unit or PCU. The locating of the PCU within the BSS is not standardized. In the example represented in FIG. 1, the PCU 22 is situated between the BSC 21, with which it communicates via an interface called Agprs, and the NSS, with which it communicates via the interface Gb.

Figure 2:
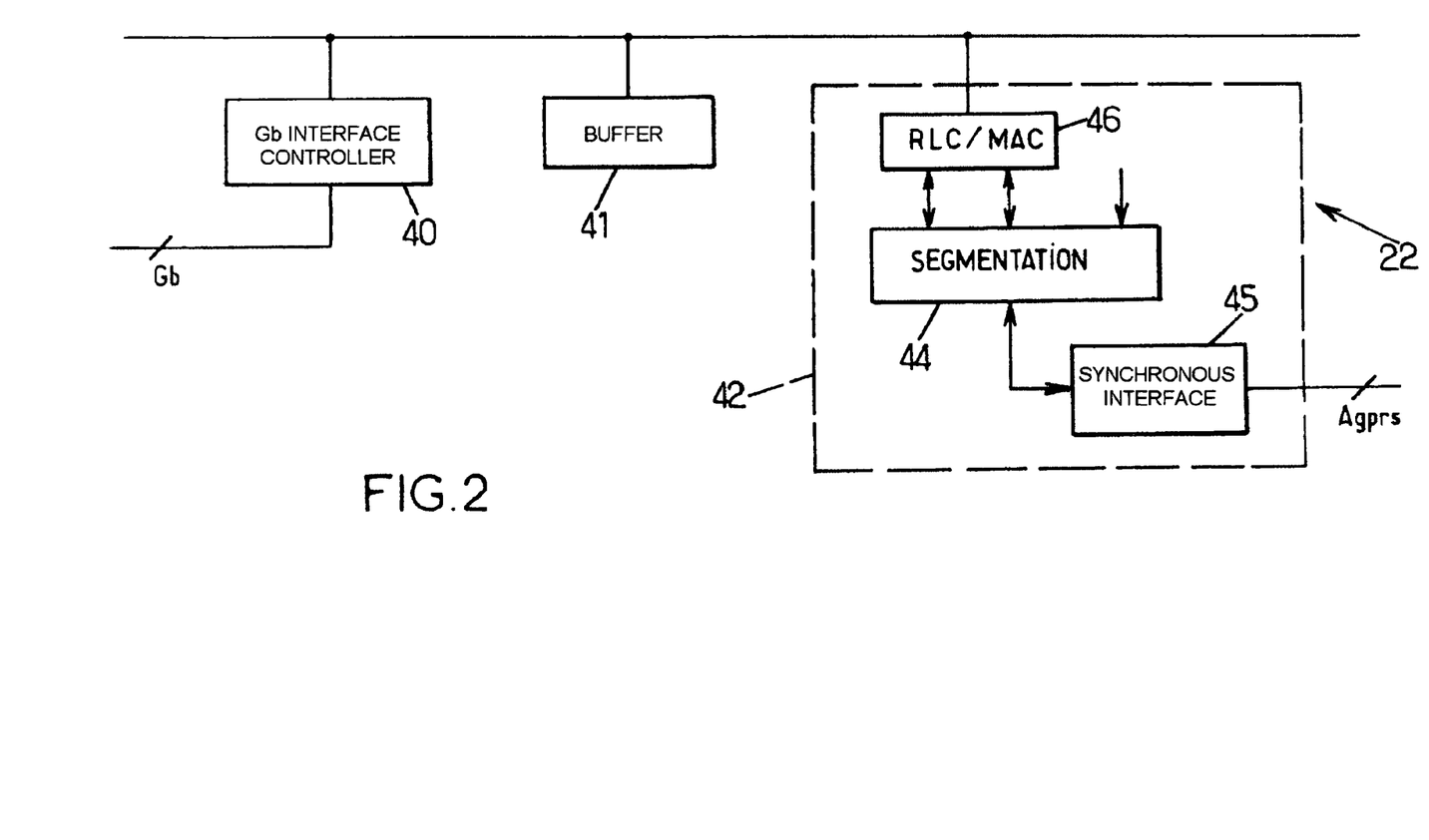
FIG. 2 is an exemplary schematic diagram of a unit for controlling packets of such a network.

FIG. 2 illustrates a possible structure of a PCU 22 situated between an SGSN 5 and a BSC 21, as in the example of FIG. 1. The reference 40 designates the Gb interface controller for the link with the SGSN 5. The data manipulated by the PCU 22 between the Gb interface controller 40 and the Agprs interface controller 42 transit via a buffer memory 41 where packet queues are recorded.

Between the PCU 22 and the BTS 20a-20b, the information is carried by 320-bit frames of TRAU (Transcoder/Rate Adaptor Unit) type. These TRAU frames are formatted and processed by a module 44 and transmitted by way of synchronous interface circuits 45 which form MIC subchannels at 16 kbit/s with the BTSs 20a-20b. Several 16-kbit/s (sub)channels can be multiplexed in time on the Agprs interface and separated by the BSC 21 for routing to the BTSs.

A module 46 of the Agprs interface controller 42 implements the radio protocols of layer 2 of the OSI model, that is to say the RLC/MAC (Radio Link Control/Medium Access Control) protocols described in the European Standard ETSI EN 301 349. "Digital cellular telecommunications system (Phase 2+); General Packet Radio Service (GPRS); Mobile Station (MS)—Base Station System (BSS) interface; Radio Link Control/Medium Access Control (RLC/MAC) protocol" (GSM 04.60, version 8.3.1, Release 1999). published by ETSI in October 2000.

The RLC sublayer forms the interface with the upper-layer protocol, called LLC (Logical Link Control). It carries out the segmentation and the reassembling of LLC protocol data units (LLC-PDU). The MAC sublayer manages the multiplexing of the blocks pertaining to the various active Temporary Block Flows (TBF) on the physical channels available, by arbitrating between the various mobile users through a scheduling mechanism.

The format of the RLC/MAC blocks used in an EGPRS system is described in the aforesaid European Standard ETSI EN 301 349. Nine modulation and coding schemes, called MCS-1 to MCS-9, are provided. They correspond to schemes for protection against transmission errors. The scheme used for a given block, as well as any puncturing scheme that may be applied, are indicated in a field CPS ("Coding and Puncturing Scheme indicator") of the EGPRS RLC/MAC header. Each RLC block contains a number of bytes depending on the modulation and coding scheme adopted for this block. A block may be transmitted every 20 ms per physical channel.

The EGPRS RLC/MAC header forms the subject of a channel coding distinct from that of the data of the block. The level of protection of this header against transmission errors is higher than that of the data so as to ensure better robustness of the signaling information. The header comprises in particular the following elements:

the transport flow indicator (TFI) which identifies the TBF to which the block pertains and hence the MS which is the receiver thereof (in the downlink direction) or the sender thereof (in the uplink direction);

the CPS;

information useful to the ARQ mechanism implemented in the RLC layer;

an 8-bit error detection code, herein below denoted CRC1.

In addition to this header, the RLC/MAC block comprises a data field including a 12-bit CRC, hereafter denoted CRC2, for detecting badly received data.

The technical specification TS 100 911, version 8.13.0, "Digital cellular telecommunications system (Phase 2+); Radio Subsystem Link Control" (3GPP TS 05.08 Release 1999), published in February 2002 by the 3GPP ("Third Generation Partnership Project") organisation describes the radio measurements to be made by the BTSs and the MSs on signals received. These measurements group together levels and indicators of quality of the signals. Among the latter, the EGPRS system provides for the calculation by an MS, over a downlink and for each of the two possible modulations (GMSK and 8-PSK), of indicators related to the bit error probability (BEP) over a radio block. Found among them are in particular the MEAN_BEP which is a mean of the bit error probability over a radio block, and the CV_BEP which is a coefficient of variation of the bit error probability over a radio block, i.e.

$$\mathrm{CV\_BEP} = \sqrt{\frac{\mathrm{variance}(BEP)}{\mathrm{MEAN\_BEP}}}.$$

The BEP degrades abruptly when a block is detected in error by the MS although nothing was transmitted by the BTS.

In the uplink direction, similar measurements may be made by the BTS in relation to each MS.

The MS for which the indicators related to the BEP are to be updated following detection of a block is that which corresponds to the TFI included in the header of the block.

The measurements made by the MS (for example the MS 10a of FIG. 1) are uploaded to the PCU 22 in a PACKET DOWNLINK ACK/NACK message, as specified in paragraph 11.2.6a of the aforesaid Standard EN 301 349. The measurements performed by the BTS (for example the BTS 20a of FIG. 1) are, for their part, transmitted to the PCU 22 in a TRAU frame.

The PCU 22 implements a link adaptation algorithm to select a coding and modulation scheme for each radio link, on the basis of the measurements that have been uploaded to it. It avails itself for example of tables that give a correspondence between a pair (MEAN_BEP, CV_BEP) and one of the schemes MCS-1 to MCS-9. It is therefore important that this algorithm be executed on relevant input parameters, in particular the MEAN_BEP which is the most meaningful.

Figure 3:
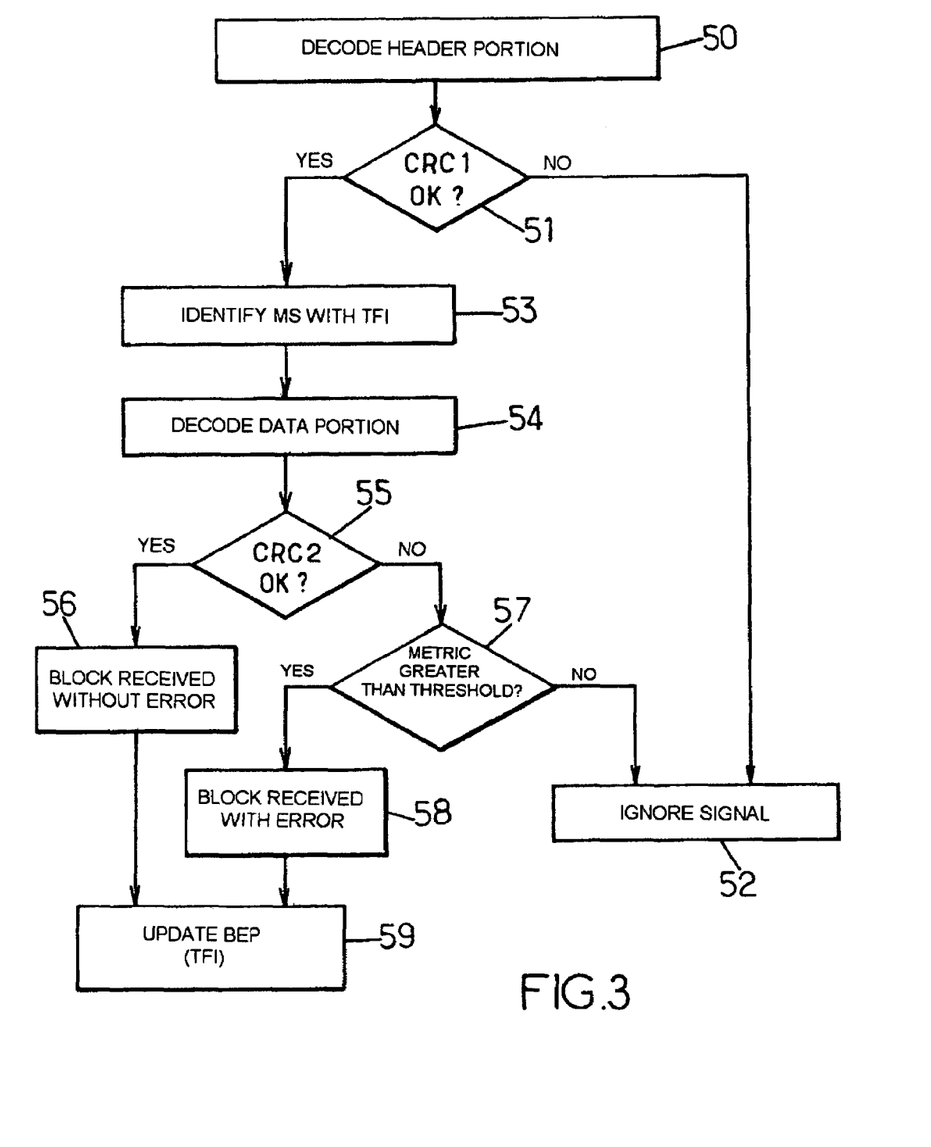
FIGS. 3 and 4 are flow charts of procedures for receiving blocks according to two embodiments of the invention.

FIG. 3 shows the procedure that the BTS can apply on reception of a radio signal segment liable to correspond to an RLC/MAC data block if an MS has sent such a block in the period considered. Given the translation (mapping) of the RLC/MAC blocks onto the physical layer, this signal segment is recovered in four radio bursts over a physical channel. After deinterleaving of the signal segment, the latter comprises a header portion in which the header of any block that may have been sent is located and a data portion in which the remainder of the data of any such block is located.

In step 50, the BTS proceeds to the channel decoding of the header portion in accordance with the code applied by the MS (cf. aforesaid ETSI EN 300 909 Standard). It then verifies whether the CRC1 recalculated agrees with that appearing in the decoded header (test 51). If the CRC1 is incorrect, the signal segment is ignored (step 52), the BTS considering itself to have picked up merely noise. If the CRC1 is correct, the BTS identifies the MS with the aid of the TFI found in the decoded header (step 53) then it decodes the data portion of the signal segment (step 54) in accordance with the code indicated in the CPS field of the decoded header. It then verifies whether the CRC2 recalculated agrees with that appearing in the decoded data field (test 55).

If the CRC2 is correct, the RLC/MAC block is declared received without error (step 56). Otherwise, an additional test 57 is performed to evaluate a likelihood criterion.

The decoding 54 being carried out with the aid of a Viterbi trellis decoder adapted to the convolutional code applied by the MS, this decoder is capable of providing, together with the values of the estimated symbols, a value of a metric that has been optimized in the trellis (see G. D. Forney, "The Viterbi Algorithm", Proc. IEEE, Vol. 61, No. 3, March 1973, pp 268-278). This metric is indicative of the likelihood of the decoded symbols. Test 57 consists in comparing it with a predetermined threshold.

If this threshold is not reached, the BTS ignores the signal segment, considering itself to have fortuitously observed a correct value of the CRC1 in the presence of noise. If the metric of the Viterbi decoder exceeds the threshold of test 57, the BTS considers itself on the other hand to have actually received a block originating from the MS associated with the TFI, but that it received it under poor conditions (false CRC2). It then declares the block received, but with an error (step 58) so that this block will not be acknowledged. After step 56 or 58, the BTS proceeds to the updating 59 of the BEP estimator for the MS associated with the TFI so that the MEAN-BEP and CV_BEP indicators are dispatched to the PCU at the appropriate time. On the other hand, this updating 59 does not take place after step 52, in particular when the likelihood criterion is not satisfied in test 57.

The probability of false detection of a block is small when the threshold of step 57 is high. Furthermore, the latter should not be taken too high so as to avoid rejecting blocks that have actually been received. On a metric scale normalized to 1, a threshold of 0.7 decreases the probability of false detection by 10% and a threshold of 0.82 decreases this probability by 99%. A preferred value of the threshold at 0.78 decreases the probability by 90%.

Figure 4:
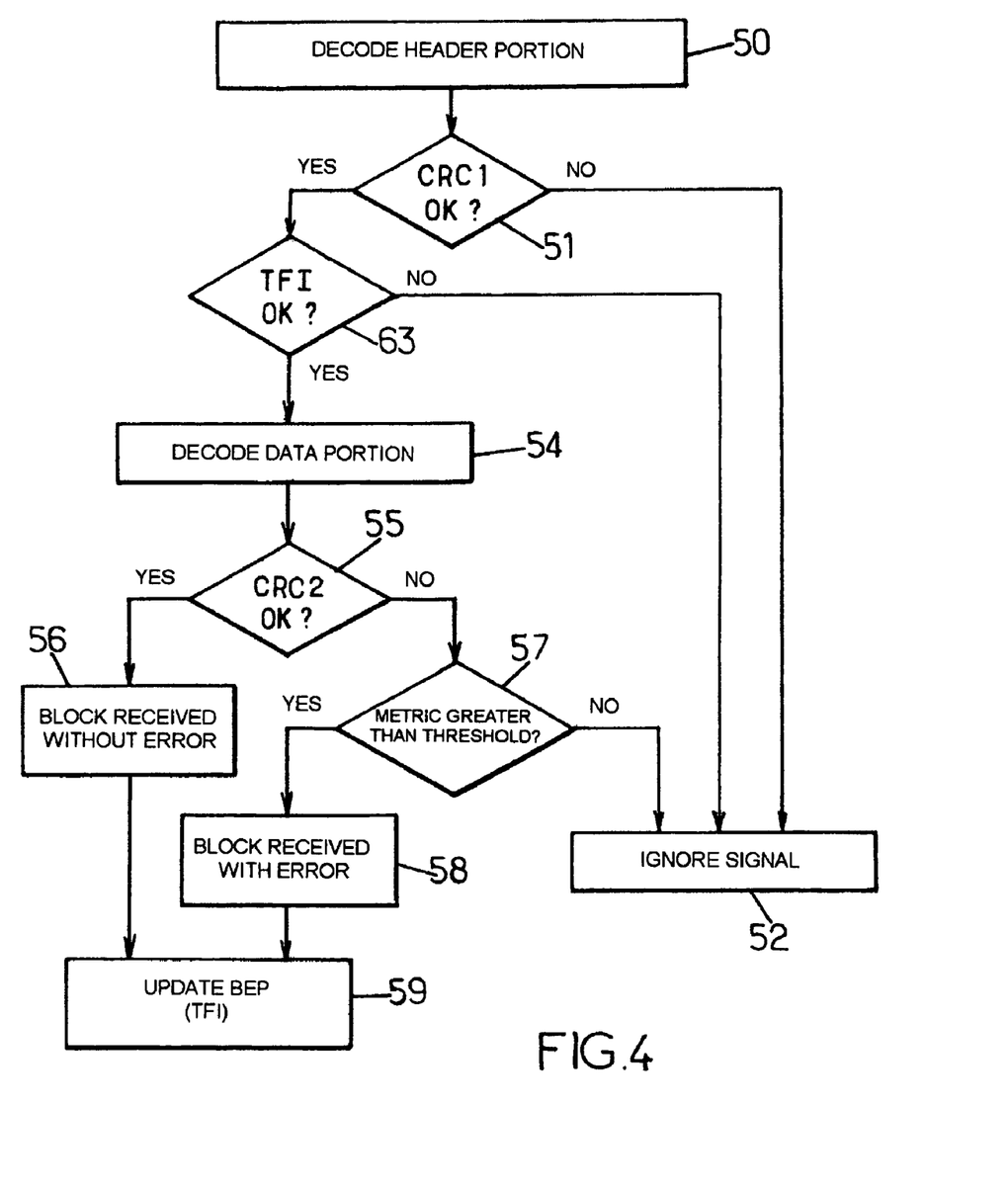

The processing applied by the MSs for the reception of downlink blocks is illustrated by FIG. 4. It is very similar to that of FIG. 3. The difference is that when the CRC1 is correct, the MS simply verifies in step 63 whether the TFI is indeed allocated to it. The signal segment is ignored if it is another MS which is pertinent. If the TFI is indeed pertinent to the MS, the latter decodes the data portion of the signal segment and continues as indicated with reference to FIG. 3.

In an application of the invention to an ARQ mechanism with incremental redundancy, the step 56 gives rise to an acknowledgement of the block, whilst the step 58 gives rise to a storing of the decoded symbols of the block and to a repetition request. The blocks eliminated by the test 57 will not disturb the ARQ mechanism.

The invention claimed is:

1. A method for receiving data blocks, each data block comprising a header and a data field including respectively first and second codes for error detection, the method comprising the steps of:

decoding, by a processor, a first portion of a signal received;

ignoring, by the processor, the signal received if the decoded signal of the first portion has a first incorrect code; and if the decoded signal of the first portion has a first correct code, determining, by the processor, a block header in accordance with the first portion and for at least one value of said block header;

decoding a second portion of the signal received;

if the decoded signal of the second portion has a second correct code, validating the block header and a corresponding data field determined in accordance with the second portion; and if the decoded signal of the second portion has a second incorrect code, validating the block header if a likelihood parameter evaluated during the, decoding of the second portion fulfils a validation criterion and rejecting the block header if the likelihood parameter does not fulfill the validation criterion.

2. The method as claimed in claim 1, wherein when the decoded signal of the first portion has a first correct code, a communication station is identified on the basis of the determined block header.

3. The method as claimed in claim 2, wherein when the decoded signal of the first portion has a first correct code, the processing of the signal received is continued only if the identified station is a station where said signal is received.

4. The method as claimed in claim 2 wherein when the decoded signal of the first portion has a first correct code, the processing of the signal is continued in relation to the identified station.

5. The method as claimed in claim 1, wherein the likelihood parameter stems from a metric of a Viterbi decoder.

6. The method as claimed in claim 1, wherein the first code for error detection is of 8 bits.

7. The method as claimed in claim 1, wherein said signal is received on a radio interface.

8. A device for receiving data blocks, each data block comprising a header and a data field including respectively first and second codes for error detection, the device comprising a processor to:
- decode a first portion of a signal received;
- ignore the signal received if the decoded signal of the first portion has a first incorrect code;
- determine a block header in accordance with the first portion if the decoded signal of the first portion has a first correct code;
- decode a second portion of the signal received for at least one value of said block header when the decoded signal of the first portion has a first correct code;
- validate the block header and a corresponding data field determined in accordance with the second portion if the decoded signal of the second portion has a second correct code;
- validate the block header if the decoded signal of the second portion has a second incorrect code and a likelihood parameter evaluated during the decoding of the second portion fulfils a validation criterion; and
- reject the block header if the decoded signal of the second portion has a second incorrect code and the likelihood parameter does not fulfill the validation criterion.

9. The device as claimed in claim 8, wherein the processor is to further identify a communication station on the basis of the determined block header when the decoded signal of the first portion has a first correct code.

10. The device as claimed in claim 9, wherein the processor is to further, when the decoded signal of the first portion has a first correct code, continue processing of the signal received only if the identified station is a station where said signal is received.

11. The device as claimed in claim 9, wherein the processor is to further, when the decoded signal of the first portion has a first correct code, continue processing of the signal received in relation to the identified station.

12. The device as claimed in claim 8, further comprising a Viterbi decoder to provide the likelihood parameter.

13. The device as claimed in claim 8, wherein the first code for error detection is of 8 bits.

14. The device as claimed in claim 8, wherein said signal is received on a radio interface.

15. A cellular radio communication station, including a device for receiving data blocks, each data block comprising a header and a data field including respectively first and second codes for error detection, wherein the device for receiving data blocks comprises a processor to:
- decode a first portion of a signal received;
- ignore the signal received if the decoded signal of the first portion has a first incorrect code;
- determine a block header in accordance with the first portion if the decoded signal of the first portion has a first correct code;
- decode a second portion of the signal received for at least one value of said block header when the decoded signal of the first portion has a first correct code;
- validate the block header and a corresponding data field determined in accordance with the second portion if the decoded signal of the second portion has a second correct code;
- validate the block header if the decoded signal of the second portion has a second incorrect code and a likelihood parameter evaluated during the decoding of the second portion fulfils a validation criterion; and
- reject the block header if the decoded signal of the second portion has a second incorrect code and the likelihood parameter does not fulfill the validation criterion.

16. The cellular radio communication station as claimed in claim 15, wherein the processor is to further identify a communication station on the basis of the determined block header when the decoded signal of the first portion has a first correct code.

17. The cellular radio communication station as claimed in claim 16, wherein the processor is to further, when the decoded signal of the first portion has a first correct code, continue processing of the signal received only if the identified station is a station where said signal is received.

18. The cellular radio communication station as claimed in claim 16, wherein the processor is to further, when the decoded signal of the first portion has a first correct code, continue processing of the signal received in relation to the identified station.

19. The cellular radio communication station as claimed in claim 15, further comprising a Viterbi decoder to provide the likelihood parameter.

20. The cellular radio communication station as claimed in claim 15, wherein the first code for error detection is of 8 bits.

21. The cellular radio communication station as claimed in claim 15, wherein said signal is received on a radio interface.

22. The cellular radio communication station as claimed in claim 15, consisting of a cellular radio communication mobile station.

23. The cellular radio communication station as claimed in claim 15, consisting of a cellular radio communication base station.

* * * * *

UNITED STATES PATENT AND TRADEMARK OFFICE
CERTIFICATE OF CORRECTION

| | | |
|---|---|---|
| PATENT NO. | : 7,616,636 B2 | Page 1 of 1 |
| APPLICATION NO. | : 10/830336 | |
| DATED | : November 10, 2009 | |
| INVENTOR(S) | : Ben Rached et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1600 days.

Signed and Sealed this

Nineteenth Day of October, 2010

David J. Kappos
*Director of the United States Patent and Trademark Office*